United States Patent [19]

Rocca et al.

[11] Patent Number: 4,496,449
[45] Date of Patent: Jan. 29, 1985

[54] ELECTRON BEAM ETCHING OF INTEGRATED CIRCUIT STRUCTURES

[75] Inventors: Jorge J. Rocca; George J. Collins, both of Fort Collins, Colo.

[73] Assignee: Colromm, Inc., Fort Collins, Colo.

[21] Appl. No.: 562,457

[22] Filed: Dec. 16, 1983

[51] Int. Cl.$^3$ .............................................. C23C 15/00
[52] U.S. Cl. ........................... 204/192 E; 204/192 R; 204/298; 250/492.3
[58] Field of Search .................... 250/492.3; 204/298, 204/192 R, 192 E

[56] References Cited

U.S. PATENT DOCUMENTS 3,130,343  4/1964  Thomson ......................... 204/192 R
4,366,383  12/1982  Sano et al. ....................... 250/492.3

OTHER PUBLICATIONS

Ogawa et al., Chem. Abstracts, 92, (1980), #190207.
Winters et al., Chem. Abstracts, 93, (1980), #59675.

*Primary Examiner*—Arthur P. Demers

[57] ABSTRACT

A new apparatus for altering the microtopography of certain solid materials commonly used in the integrated circuit industry by electron beam induced etching is described. This is accomplished with one or more glow discharge electron beam guns operating in a controlled gas environment. Specially designed versions of these guns perform the dual functions of dissociating certain donors of reactive gases in close proximity to the substrate surface and enhancing surface reactions anisotropically with the directed electron beam energy. The geometrical relationship between the substrate and the electron beams is chosen to optimize the role of each beam for its particular function. The operating gas environment is typically a carefully controlled mixture of a non-reactive buffer gas and one or more reactive gases. The gas flow rates, partial pressures, and direction are controlled by valves, regulators, and nozzles connected to the low pressure vessel. The proper vessel pressure is maintained by a vacuum pump through a flow limiting throttle valve. The etching process begins when the electron beams are energized and the proper gas environment is established. The dissociated reactive gas radicals created by the electron beams react with the substrate to form volatile compounds which are subsequently evacuated by the gas flow system. The surface of an actual integrated circuit substrate is covered by a masking material resistant to the above etching process, so that when the etching process is completed, removal of such a mask leaves a well defined geometrical pattern. The apparatus of the present invention is capable of rapidly etching geometrical patterns with exceptional resolution and well defined profiles and with a high degree of controllability.

20 Claims, 3 Drawing Figures

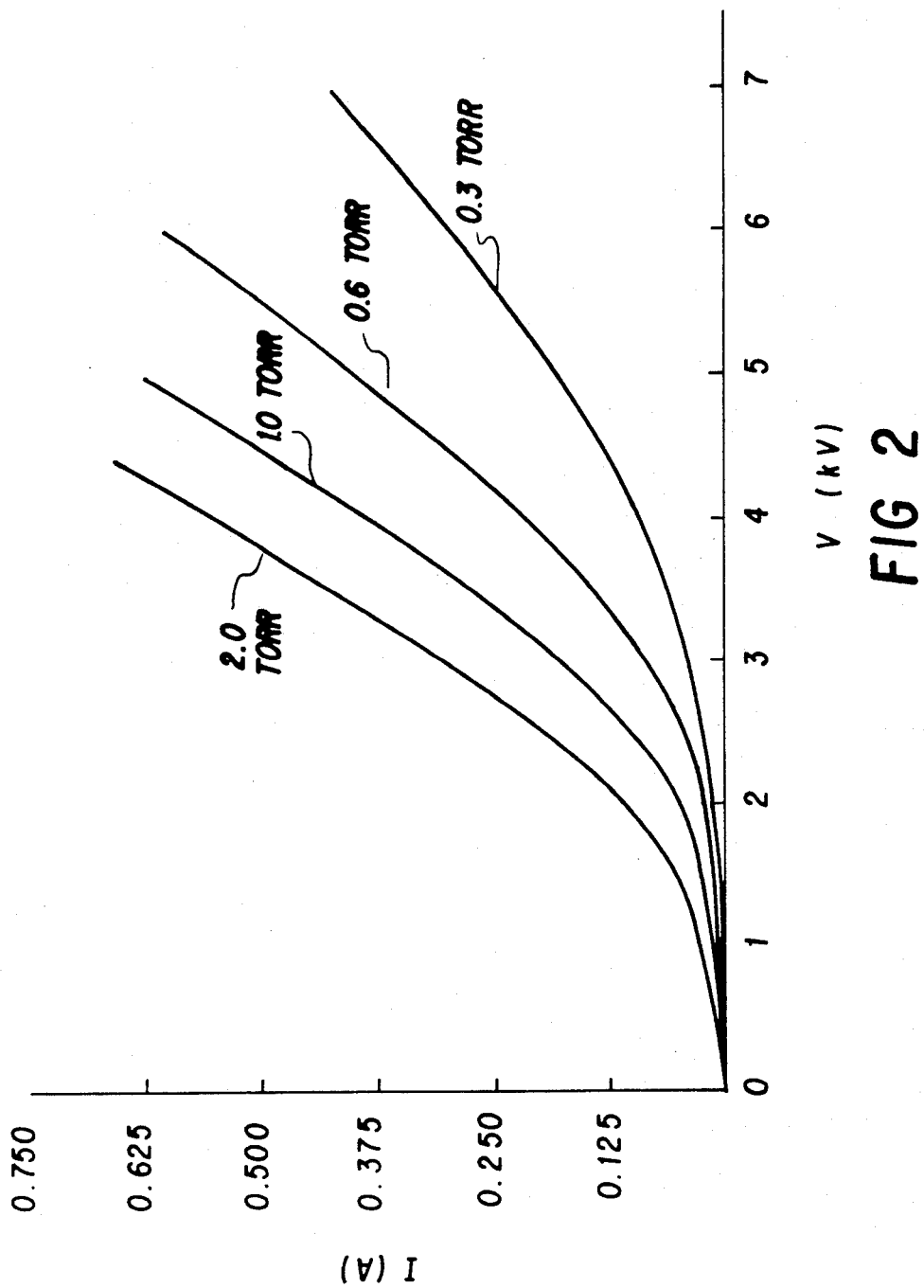

ELECTRON BEAM ETCHING OF INTEGRATED CIRCUIT STRUCTURES

BACKGROUND AND SUMMARY OF THE INVENTION

The etching of circuit patterns on integrated circuit substrate materials has been accomplished in a number of ways. The most common method has been the use of wet chemical reagents in combination with a chemically resistant mask on the substrate surface to selectively etch the desired circuit pattern. The industry trend to smaller and smaller integrated circuit dimensions requires higher resolution of the etching profiles than is possible with wet chemistry because of the isotropic undercutting of the resistant mask when small ratios of linewidth to film thickness are required. Certain other limitations of wet chemical etching techniques have prompted the industry to investigate other methods to achieve high resolution pattern transfer. In particular, gas phase dry etching by radiation enhanced surface chemistry has been found to produce very highly resolved patterns. A number of mechanisms have been proposed to account for the high reaction rates achieved by these methods, but the fact that the substrate surface is made highly receptive to anisotropic etching by photon beams, sheaths in radio frequency plasmas or particle beams has spurred considerable research in the industry. At present, each of these radiation enhanced etching systems has disadvantages. For example, photon beams, generally in the ultra violet region, are expensive and of low reliability if laser technology is employed. Radio frequency plasmas achieve collimation of ions passing through sheaths and thereby achieve directional ion motion toward the intended substrate material. However, energetic ions also cause ion bombardment damage to the film or device being etched as well as undesired impurity sputtering from chamber walls. Electron beams with thermionic cathodes are not tolerant of reactive gases needed to perform the etching process and typically have small area coverage.

It is therefore an object of the present invention to provide an electron beam etching system in which undesired impurity sputtering is eliminated because in the present invention the energy flux to the substrate is provided by a beam of electrons instead of a beam of ions. It is a further object of the present invention to provide an electron beam etching system in which a parallel electron beam to accomplish substantially isotropic etching and a perpendicular electron beam to accomplish substantially anisotropic etching are combined to permit highly controlled etching of a substrate surface, allowing tailoring of the etching profiles. It is yet another object of the present invention to provide an electron beam etching system in which plasma parameters such as gas pressure, ion density, and electron temperature are generally more independently controllable than in conventional dry etching systems.

These and other objects are accomplished in accordance with the illustrated preferred embodiment of the invention by employing one or more large area electron beam guns to provide directed energy to the surface of a substrate and to dissociate molecular donors in the gas phase to create free radicals that react with the substrate to accomplish the etching process.

DESCRIPTION OF THE DRAWINGS

FIG. 2 is a curve showing current versus voltage dependence of a typical large area glow discharge electron beam gun at different helium pressures.

DESCRIPTION OF THE PREFERRED EMBODIMENT

Figure 1:
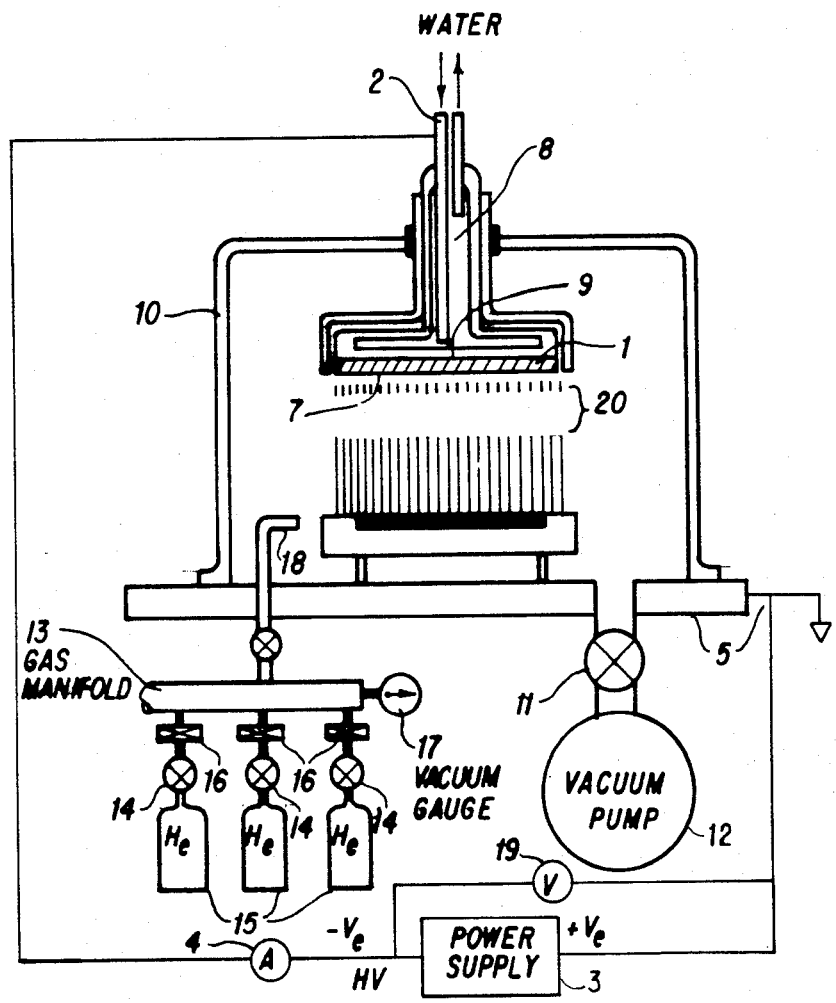
FIG. 1 is a schematic diagram illustrating a glow discharge electron beam gun immersed in a controlled gas environment.

With reference to FIG. 1, there is shown in cross section a large area glow discharge electron beam gun immersed in a controlled gas environment to permit etching of one or more complete wafers simultaneously, depending on the electron beam diameter chosen by the user. An appropriate solid cathode material 1 is connected by a feedthrough 2 to a current controlled negative high voltage power supply 3. An ammeter 4 for monitoring current flow is connected to counter electrode 5 which is, in turn, connected to ground. The cathode 1 is surrounded by an insulating shield 6 to limit current flow to the exposed cathode surface 7. A heat exchanger 8 is closely coupled to the cathode material 1 via a metal support plate 9 to assist cathode cooling. The entire cathode structure is supported by a pressure vessel structure 10 mounted over a metal base plate which also acts as counter electrode 5 and is preferably at ground potential. Base plate 5 is fitted with a throttle valve 11 which controls the rate of gas flow to a vacuum pump 12. Inlet valve manifold 13 has a plurality of valves controlling the input to structure 10 of one or more gases whose flow rates are monitored by gauges 14 from storage tanks 15 and mass flow regulators 16. The sum of the partial pressures of one or more of the gases is monitored by pressure gauge 17. Preferred direction of gas flow from the inlet valves of manifold 13 inside structure 10 is obtained by a nozzle 18 oriented as desired.

Operation of the large area glow discharge electron beam gun of FIG. 1 is accomplished by first evacuating structure 10 by high vacuum pump 12. When pressure gauge 17 indicates that a vacuum of about $10^{-3}$ torr or better has been reached, a gas such as helium is admitted by valve 30 to structure 10. The adjustment of throttle valve 11 and gas inlet valve 30 permits control of the gas pressure monitored by gauge 17 over a suitable operating range for the electron beam gun, typically between 0.05 torr and 5 torr. At a selected pressure, power supply 3 is turned on and the current monitored by ammeter 4, while the voltage drop between points 2 and 5 is monitored by voltmeter 19. Visual observation of the glow discharge between cathode surface 1 and counter electrode 5 shows a gas pressure dependent dark space region slightly below and parallel to the cathode surface. This phenomena has been extensively studied and explained in the literature pertaining to low pressure gas discharges.

Briefly, the cathode dark space 20 is a region of high electric field where most of the acceleration of charged particles in an electrified gas takes place, and provides the energy mechanism for the emission of electrons from a non-thermionic cathode. The electrified gas in this case consists of helium ions, which, having a positive charge, are accelerated toward the negatively charged cathode through dark space 20. Upon striking the solid cathode material, the kinetic and the internal energy of the ion releases one or more electrons from the cathode front surface, and in turn becomes a neutral helium atom. The electrons, being negatively charged, are accelerated away from the cathode 1 in the high field region of the cathode dark space 20.

The high electric field equipotential gradients existing in the cathode dark space are essentially parallel to the cathode so that the electrons are accelerated and highly collimated along a path orthogonal to the cathode surface. Once launched, the collimation of these energetic electrons persists for considerable distances before random collisions with the background gas eventually scatter the beam electrons with the subsequent degradation of the beam profile and energy. The electron beam as a function of helium pressure for a typical large area solid cathode is shown in FIG. 2. It is important to note that this electron beam is electrically neutralized because of the approximately equal number of positive ions necessarily present in any given plasma volume, except the dark space region, of the electron beam created plasma. This property of our novel electron beam is particularly important where the production of high electric fields on integrated circuit substrates is detrimental.

Figure 3:
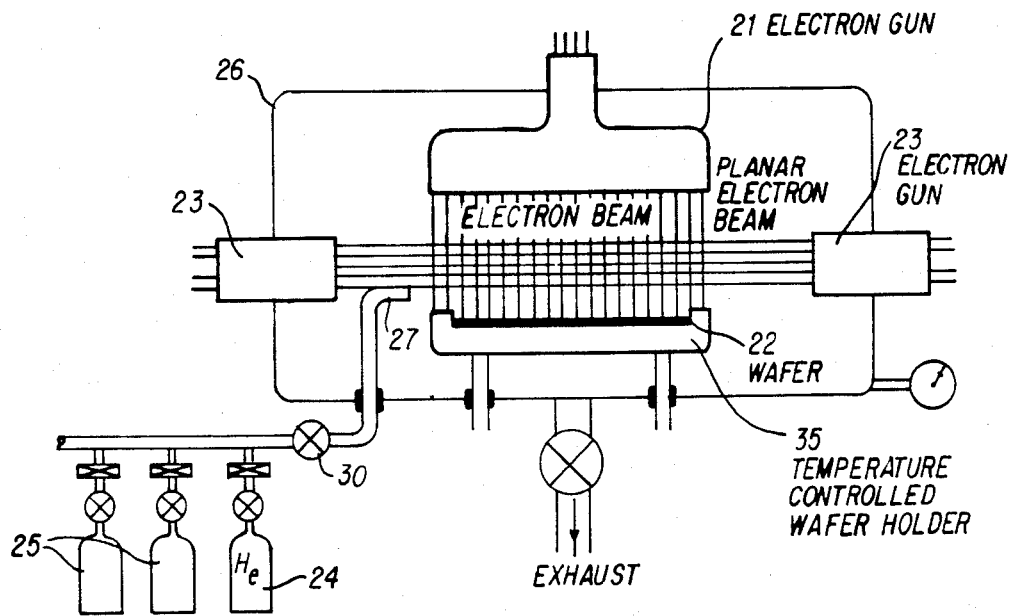
FIG. 3 is a schematic diagram illustrating a large area electron beam etching system.

Another important feature of our neutralized electron beam is the ability to position additional electron beam guns in close proximity to each other without any substantial interaction of one beam with another. The importance of this feature will become apparent in the subsequent description of our new etching process. Referring now to FIG. 3, we show a cross section of a pressure vessel similar to that of FIG. 1, but having in place additional electron beam guns and means for positioning substrate materials with respect to such electron beam guns. Having explained now controlled collimated energy can be delivered by the electron beam gun of the present invention, its use in accomplishing substrate etching will now be described in detail with reference to FIG. 3.

As illustrated in FIG. 3, a large area electron beam gun 21 is arranged to impinge directly upon the substrate wafer 22, the substrate wafer 22 being supported by a structure 35. The temperature of structure 35 may be controlled using well known techniques to be either above or below room temperature. In addition, the electrical potential of structure 35 may be conventionally controlled to effect an electrical bias condition of the substrate wafer 22 with respect to the potential of the electrified gas or plasma. The planar electron beam gun 23 supplies an electron beam that is orthogonal to that supplied by electron beam gun 21, and is positioned slightly above and parallel to the substrate wafer 22. The energy density in each beam is independently controlled, the planar beam having a considerably higher density. After admission of a non-reactive buffer gas 24, such as helium, and a controlled partial pressure of a halogen containing reactive gas 25, such as carbon tetraflouride, to pressure vessel 26 the electron beam guns 21 and 23 are turned on. The beam current of electron beam gun 21 is adjusted independently of that of planar electron beam gun 23. The beam from electron beam gun 21 allows for control of electron enhanced surface reaction rates beyond those produced solely by the chemically reactive radicals produced just above the substrate surface by the dissociative action of the planar electron beam on the reactive gas. The close proximity of the etching free radicals to the target is assisted by gas nozzles 27 which direct the reactive gas in laminar flow in the space where the high energy density planar electron beam is located. This arrangement makes for efficient use of the radicals which chemically react with the substrate material to produce volatile compounds. A continuous gas flow through the vessel ensures that the volatile etching byproducts are removed as fresh gas is admitted by valve 30. The desired geometric pattern to be etched on the substrate material is obtained by masking the substrate with a material resistant to the effects of the electron beam generated chemistry.

Another of the features of the present invention is the high resolution and ideal profiles that can be obtained by controlling the electron beam gun energy densities. The large area electron beam orthogonal to the substrate produces highly anisotropic etching, while the parallel or planar electron beam produces substantially isotropic etching. It is clear that this independence permits the selection of highly suitable profiles needed for integrated circuit step coverage. Although the preferred embodiment described above utilizes one large area electron beam gun positioned orthogonal to the substrate surface to be etched and one planar electron beam gun positioned parallel to the substrate surface to be etched, additional planar electron beam guns may be added to increase area coverage and/or homogeneity of the interaction region.

We claim:

1. Electron beam induced etching apparatus for etching a surface of a solid material, the apparatus comprising:
   a large area glow discharge electron gun for producing an energy controlled homogeneous source of collimated beam electrons travelling perpendicular to the surface of the solid material to be etched;
   chamber means surrounding the large are glow discharge electron gun and the solid material to be etched to provide a controlled low pressure gas environment;
   means for controlling the energy, current, and time dependence of the beam electrons;
   means for selecting, admitting, and controlling the partial pressures of one or more gases in said chamber means; and
   vacuum pump means for circulating the one or more gases through said chamber means.

2. Electron beam induced etching apparatus as in claim 1 further comprising one or more additional large area glow discharge electron guns for producing an energy controlled homogeneous sheet of collimated beam electrons travelling parallel to the surface of the solid material to be etched.

3. Electron beam induced etching apparatus as in claim 1 further comprising support means for holding the solid material to be etched, the support means including means for controlling the temperature of the solid material to be etched during an etching operation.

4. Electron beam induced etching apparatus as in claim 2 further comprising support means for holding the solid material to be etched, the support means including means for controlling the temperature of the solid material to be etched during an etching operation.

5. Electron beam induced etching apparatus as in claim 1 wherein one of said one or more gases is helium.

6. Electron beam induced etching apparatus as in claim 2 wherein one of said one or more gases is helium.

7. Electron beam induced etching apparatus as in claim 1 wherein one of said one or more gases is a halogen.

8. Electron beam induced etching apparatus as in claim 2 wherein one of said one or more gases is a halogen.

9. Electron beam induced etching apparatus as in claim 1 wherein one of said one or more gases is a molecule containing a halogen.

10. Electron beam induced etching apparatus as in claim 2 wherein one of said one or more gases is a molecule containing a halogen.

11. Electron beam induced etching apparatus as in claim 1 wherein one of said one or more gases is hydrogen.

12. Electron beam induced etching apparatus as in claim 1 wherein one of said one or more gases is oxygen.

13. Electron beam induced etching apparatus as in claim 1 wherein one of said one or more gases is a molecule containing hydrogen.

14. Electron beam induced etching apparatus as in claim 1 wherein one of said one or more gases is a molecule containing oxygen.

15. Electron beam induced etching apparatus as in claim 2 wherein one of said one or more gases is hydrogen.

16. Electron beam induced etching apparatus as in claim 2 wherein one of said one or more gases is oxygen.

17. Electron beam induced etching apparatus as in claim 2 wherein one of said one or more gases is a molecule containing hydrogen.

18. Electron beam induced etching apparatus as in claim 2 wherein one of said one or more gases is a molecule containing oxygen.

19. Electron beam induced etching apparatus as in claim 1, further comprising:
   support means for holding the solid material to be etched; and
   means for electrically biasing the solid material to be etched with respect to the electrical potential of a plasma within the chamber means.

20. Electron beam induced etching apparatus as in claim 2, further comprising:
   support means for holding the solid material to be etched; and
   means for electrically biasing the solid material to be etched with respect to the electrical potential of a plasma within the chamber means.

* * * * *